United States Patent [19]

Tsukada

[11] Patent Number: 5,633,826
[45] Date of Patent: May 27, 1997

[54] SEMICONDUCTOR MEMORY WHEREIN A SIGNAL SELECTIVELY SUBSTITUTES A REDUNDANT MEMORY CELL LINK FOR A FAULTY ORDINARY MEMORY CELL LINK

[75] Inventor: Shyuichi Tsukada, Tokyo, Japan

[73] Assignee: NEC Corporation, Tokyo, Japan

[21] Appl. No.: 561,261

[22] Filed: Nov. 21, 1995

[30]  Foreign Application Priority Data

Nov. 22, 1994  [JP]  Japan .................................. 6-287728

[51] Int. Cl.⁶ .................................................. G11C 7/00
[52] U.S. Cl. .................... 365/200; 365/201; 365/230.06; 365/230.08
[58] Field of Search .................................. 365/200, 201, 365/230.06, 230.08, 225.7

[56]  References Cited

U.S. PATENT DOCUMENTS 5,404,331  4/1995  McClure .................................. 365/250
5,532,966  7/1996  Poteet et al. ............................ 365/250

FOREIGN PATENT DOCUMENTS 1273298  11/1989  Japan .

*Primary Examiner*—David C. Nelms
*Assistant Examiner*—F. Niranjan
*Attorney, Agent, or Firm*—Whitham, Curtis, Whitham & McGinn

[57]  ABSTRACT

For a semiconductor memory device comprising, besides a redundant array, memory cells of an ordinary array in links (columns, rows) accessed by an ordinary address signal, an additional address signal of a high level activates, when the ordinary address signal indicates a preliminarily stored faulty link, a redundant circuitry activating signal for suspending operation of an ordinary link selecting circuit to select by a redundant link selecting circuit a substitution link for the faulty link. When given a low level, the additional address signal deactivates the redundant circuitry activating signal to select ordinary links by the ordinary address signal. Before the faulty link is stored, the low level serves as a test mode signal for testing the ordinary and the redundant arrays in a common mode of operation. To be switched by a block switch signal into a bit and a bit-word structure, a memory device may comprise two or more memory blocks, each comprising the ordinary and the redundant arrays, and is preferably supplied additionally with the test mode signal with a high level to test the ordinary and the redundant arrays in individual memory blocks.

10 Claims, 7 Drawing Sheets

SEMICONDUCTOR MEMORY WHEREIN A SIGNAL SELECTIVELY SUBSTITUTES A REDUNDANT MEMORY CELL LINK FOR A FAULTY ORDINARY MEMORY CELL LINK

BACKGROUND OF THE INVENTION

This invention relates to a semiconductor memory device comprising a redundant or spare array of redundant memory cells arranged in a rectangular matrix for use in substitution for a faulty element of an ordinary or normally used array of ordinary memory cells placed in a square matrix.

A conventional semiconductor memory device of this type is disclosed in Japanese Patent Prepublication (A) No. 273,298 of 1989. In the manner which will later be described in greater detail, this semiconductor memory device comprises an ordinary array comprising ordinary memory cells in M ordinary columns and E ordinary rows, where M represents a first predetermined integer and will later be represented alternatively by N. A redundant array comprises redundant memory cells in P redundant columns and Q redundant rows, where P and Q represent second and third predetermined integers. Either of the second and the third predetermined integers is usually equal to the first predetermined integer. Throughout the following, either of the columns and the rows will be called links. At least one of the ordinary and the redundant links may or may not include a faulty link which includes, for example, a faulty memory cell. The first predetermined integer is alternatively called a first plurality. A second plurality refers to P or Q used for the redundant links, from which a faulty redundant link may be excluded.

A faulty address indicating circuit is referred to in the Japanese Patent Prepublication as a fuse and indicates an address of the faulty ordinary or redundant link. The fuse may comprise a certain number of fuse elements, each of which breaks when an excessive electric current flows typically through in ordinary link. In this event, the link in question is deemed as the faulty link.

Connected to the ordinary array, in ordinary link selecting circuit or decoder is supplied with an ordinary link address signal indicative of a selected link among the ordinary links and selects the selected link from the ordinary links at a time unless this operation is inhibited in the manner which will presently be described. Connected to the redundant array, a redundant link selecting circuit includes the faulty indicating circuit to activate a redundant circuitry activating signal by using a skillful circuit which will later become clear. Redundant circuitry refers primarily to the redundant array. Supplied with the ordinary link address signal, the redundant link selecting circuit selects a substitution link among the redundant links for use in substitution for one of the ordinary links that is indicated as the faulty link by the faulty address indicating circuit. The redundant circuitry activating signal Is delivered to the ordinary link selecting circuit. When the redundant circuitry activating signal is activated, the ordinary link selecting circuit selects none Of the ordinary links. Otherwise, the ordinary link selecting circuit is operable in the manner described before.

Although not described in the Japanese Patent Prepublication, the semiconductor memory device may comprise first and second memory blocks, each comprising the ordinary and the redundant arrays of the type described. This is the case when the semiconductor memory device has a large memory capacity to be, for example, a dynamic random access memory (DRAM) of four megabits or more. In this event, the faulty address indicating circuit and the ordinary and the redundant link selecting circuits may be used in common to the first and the second memory blocks. In order to put the semiconductor memory device in normal operation of an address structure among different bit structures, an address format switch signal is used as a block switch signal to make an address format switching circuit selectively put either both of or a selected block of the memory blocks.

Alternatively, the semiconductor memory device of the large memory capacity is used in a word structure, such as N bits by 2N words and (N+1) bits by N words with a word format switch signal used as the block switch signal. In this event, an R/W (read/write) control circuit Is used in each of the memory blocks to R/W access the ordinary and the redundant arrays in compliance with a control signal produced in response to the word format switch signal and to an additional row address signal indicative of an (N+1)-th ordinary row. In common to the first and the second memory blocks, a word format switching circuit is used to produce the control signal as a first and a second control signal which are not and are accompanied by the additional row address signal. Accessed by the R/W control circuits supplied with the first control signal, the ordinary arrays of the first and the second memory blocks are collectively used as an N-bit by 2N-word structure. Controlled by the second control signal, these ordinary arrays are individually accessed substantially as an (N+1)-bit by N-word structure.

Use of the redundant array or arrays is desirable in order to raise a yield of manufacture. In practice, the semiconductor memory device is tested before completely manufactured. In order to carry out the test, the semiconductor device is put in a test mode of operation by a test mode signal. Before put in the test mode, the ordinary links are successively tested by using the ordinary link address signal. If a faulty link is found during the test, the faulty address indicating circuit is made to indicate the address of the faulty link. Put in the test mode, the redundant links are successively tested by again using the ordinary link address signal. After the test for the redundant array, it is possible to use the semiconductor memory device as one including no fault or defect.

In the conventional semiconductor memory device disclosed in the Japanese Patent Prepublication, the skillful circuit is used in consideration of the test mode signal for the redundant array. Test of the ordinary array is, however, impossible in the meanwhile and must be carried out in a different mode of operation. It therefore takes a long test time. On putting the conventional semiconductor memory device into this different mode of operation, a complicated circuit and pads for additional test signals must be manufactured on a semiconductor chip. This necessitates a wide chip area. In addition, the test mode signal and the additional test signals must have specific patterns. Such disadvantages are experienced also in the semiconductor memory device comprising a plurality of memory blocks.

SUMMARY OF THE INVENTION

It is consequently an object of the present invention to provide a semiconductor memory device which comprises an ordinary and a redundant memory array and which is compact and simple in structure, can be tested in a shorter test time, and is capable of using a test pattern of an increased freedom.

It is a different object of this invention to provide a semiconductor memory device which is of the type described and which comprises a plurality of memory blocks, each comprising an ordinary and a redundant memory array, and can be used in different bit structures.

It is a further different object of this invention to provide a semiconductor memory device which is of the type described and which comprises a plurality of memory blocks of ordinary and redundant memory arrays and can be used in different bit and word structures.

Other objects of this invention will become clear as the description proceeds.

In accordance with an aspect of this invention, there is provided a semiconductor memory device comprising an ordinary array comprising ordinary memory cells in a first plurality of ordinary links, a redundant array comprising redundant memory cells in redundant links for use as ones, a second plurality in number, of the ordinary links, a faulty address 1ha/caring circuit indicative of a faulty link, a redundant link selecting circuit including the faulty address indicating circuit to selectively activate a redundant circuitry activating signal and supplied with an ordinary link address signal indicative of a selected link among the ordinary links at a time to selectively select a substitution link among the redundant links for use in substitution for one of the ordinary links that is indicated as the faulty link, and an ordinary link selecting circuit responsive to the ordinary link address signal and to the redundant circuitry activating signal for selecting the selected link and none of the ordinary links when the redundant circuitry activating signal is not and is activated, respectively, wherein the redundant link selecting circuit is supplied with a predetermined signal selectively given first and second levels so as., when the predetermined signal is given the second level, to render the faulty address indicating circuit inoperative and to select the substitution link when the ordinary link address signal indicates the faulty link and so as, when the predetermined signal is given the first level, to activate the redundant circuitry activating signal for selection of the substitution link and to deactivate the redundant circuitry activating signal for selection of none of the redundant links when both of the faulty address indicating circuit and the ordinary link address signal indicate the faulty link and when neither the faulty address indicating circuit nor the ordinary link address signal indicates the faulty link.

In accordance with a different aspect of this invention, there is provided a semiconductor memory device which comprises first and second memory blocks, each comprising an ordinary array comprising ordinary memory cells in a first plurality or ordinary links, a redundant array comprising redundant memory cells in redundant links for use as ones, a second plurality in number, of the ordinary links, a faulty address indicating circuit indicative of a faulty link, a redundant link selecting circuit including the faulty address indicating circuit to selectively activate a redundant circuitry activating signal and supplied with an ordinary link address signal indicative of a selected link among the ordinary links at a time to selectively select a substitution link among the redundant links for use in substitution for one of the ordinary links that is indicated as the faulty link, an ordinary link selecting circuit responsive to the ordinary link address signal for selecting the selected link and none of the ordinary links when the redundant circuitry activating signal is not and is activated, respectively, an address format selecting circuit responsive to an address format switch signal selectively given first and second address format levels and to an additional link address signal selectively given first and second address levels for activating both of and a selected block of the first and the second memory blocks when the address format switch signal is given the first address format level irrespective of the first and the second address levels of the additional link address signal and when the address format switch signal and the additional link address signal are given the second address format and address levels, respectively, which further comprises (A) a redundant array control circuit for keeping the additional link address signal of the first and the second address levels as a predetermined signal given first and second levels, respectively, when the address format switch signal 18 given the second address level, and In which (B) the redundant link selecting circuit is supplied, in at least one of the first and the second memory blocks that is activated, with the predetermined signal so as, when the predetermined signal is given the second level, to render the faulty address indicating circuit inoperable and to select the substitution link when the ordinary link address signal indicates the faulty link and so as, when the predetermined signal is given the first level, to activate the redundant circuitry activating signal for selection of the substitution link and to deactivate the redundant circuitry activating signal for selection of none of the redundant links when both of the faulty address indicating circuit and the ordinary link address signal indicate the faulty link and when neither the faulty address indicating circuit nor the ordinary link address signal indicates the faulty link, respectively.

In accordance with a further different aspect of this invention, there is provided a semiconductor memory device which comprises first and second memory blocks, each comprising an ordinary array comprising ordinary memory cells in ordinary columns, a predetermined integer N in number, and in a first plurality of ordinary rows, a redundant array comprising redundant memory cells in redundant columns, N in number, and is redundant rows for use as ones, a second plurality in number, of the ordinary rows, and a read/write control circuit responsive to a control signal for read/write accessing the ordinary and the redundant arrays, which further comprises in common to the first and the second memory blocks a faulty address indicating circuit indicative of a faulty row, a redundant row selecting circuit including the faulty address indicating circuit to selectively activate a redundant circuitry activating signal and supplied with an ordinary row address signal indicative of a selected row among the ordinary rows at a time to selectively select a substitution row among the redundant rows for use in substitution for one of the ordinary rows that is indicated as the faulty row, an ordinary row selecting circuit responsive to the ordinary row address signal for selecting the selected row and none of the ordinary rows when the redundant circuitry activating signal is not and is activated, respectively, and a word format switching circuit responsive to a word format switch signal selectively given first and second word format levels and to an additional row address signal selectively given first and second address levels for producing the control signal without and together with the additional row address signal as first and second control signals when the word format 6Witch signal is given the first and the second word format levels, respectively, in which the ordinary array is a first and a second array in the first and the second memory blocks, respectively, the read/write control circuit being a first and a second control circuit in the first and the second memory blocks, respectively, the first and the second control circuits being responsive to the first and the second control signals, respectively, to access the first and the second arrays collectively and individually as an N-bit by 2N-word structure and substantially as an (N-1)-bit by N-word structure with the additional row address signal of the first address level used, respectively, which still further comprises (A) in common to the first and the second memory blocks a redundant circuitry control circuit responsive to the word format switch signal Of the first and the second word format levels for supplying the redundant row selecting circuit with the additional row address signal of the first and the second address levels, respectively, and in which (B) the redundant row selecting circuit selects the redundant rows in each of the first and the second memory blocks in correspondence to the ordinary address signal regardless of the first and the second address levels of the additional row address signal when the ordinary row address signal indicates the faulty row.

DESCRIPTION OF THE PREFERRED EMBODIMENTS

Figure 1:
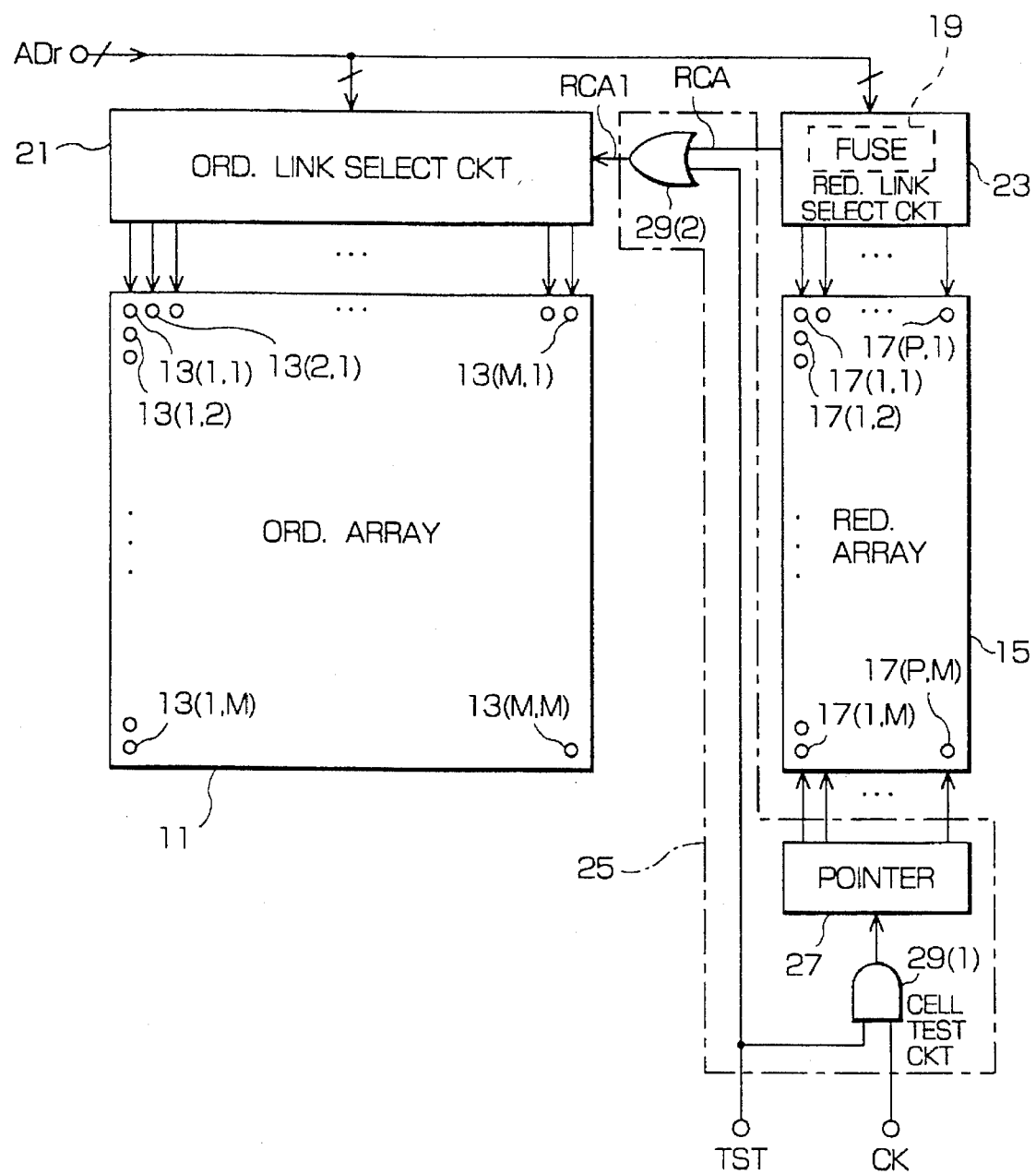
FIG. 1 Is a block diagram of a conventional semiconductor memory device.
Figure 2:
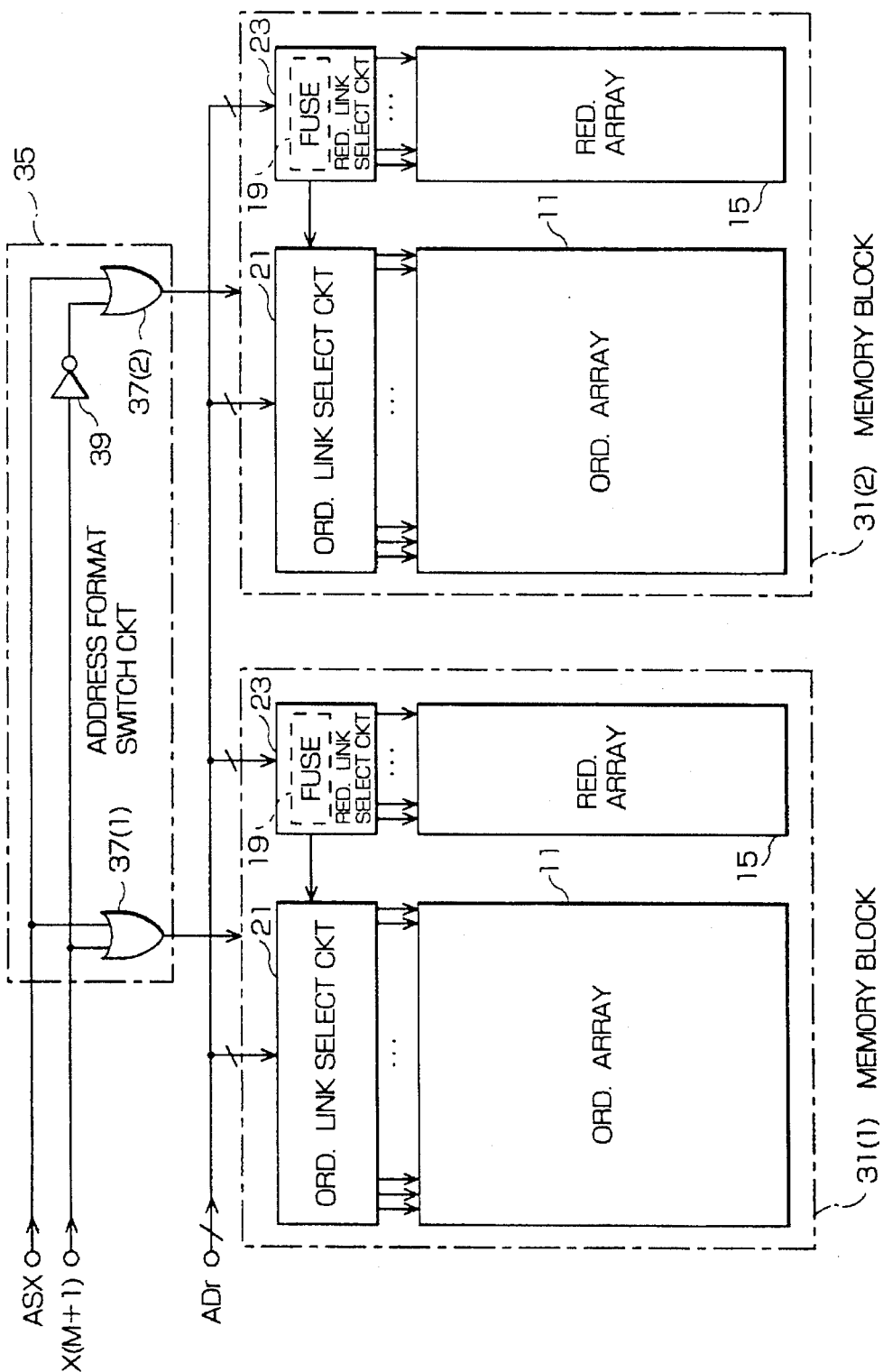
FIG. 2 is a block diagram of another conventional semiconductor memory device.
Figure 3:
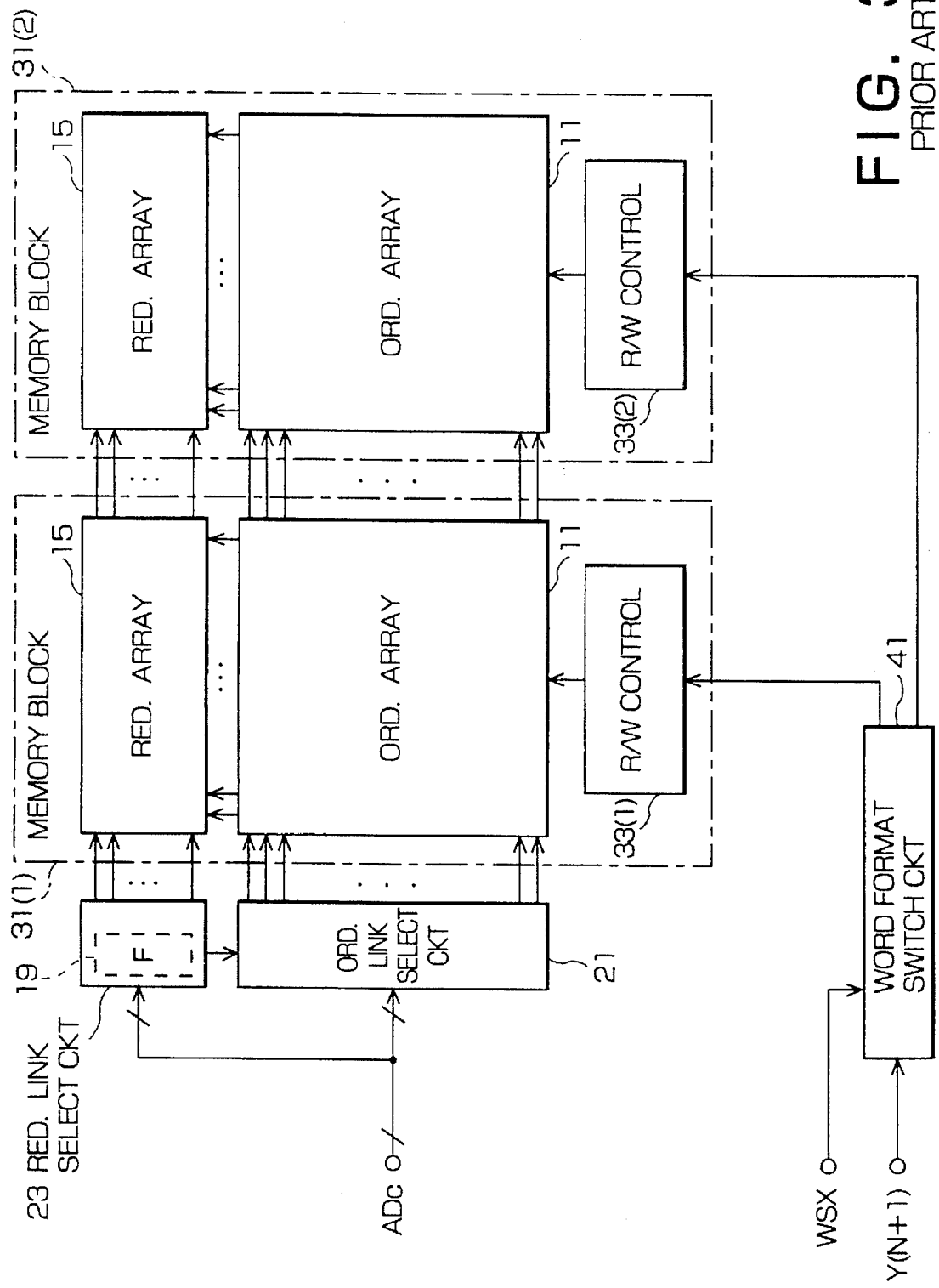
FIG. 3 is a block diagram of still another conventional semiconductor memory device.

Referring to FIGS. 1 through 3, conventional semiconductor memory devices will first be described in Order to facilitate an understanding of the present invention. Shown FIG. 1 is the semiconductor memory device revealed in the Japanese Patent Prepublication which is referred to heretobefore. Throughout the drawing figures, similar or corresponding parts and signals are designated by like reference numerals and symbols.

In FIG. 1, the semiconductor memory device comprises an ordinary array 11 of ordinary memory cells 13 or, more particularly, 13(1,1), 13(1,2), ..., and 13(1,M); 13(2,1), ...; ...; and 13(M,1), ..., and 13 (M,M), where M represents a first plurality which depends on a memory capacity of the memory device. In this manner, the ordinary array 11 comprising the ordinary memory cells 13 in first through M-th ordinary columns and first through M-th ordinary rows, namely. In ordinary links vertically and horizontally. Depending on circumstances, the number of memory cells 13 in each ordinary link may be different between each column and each row.

A redundant array 15 comprises redundant memory cells 17 or 17(1,1), 17(1,2), ..., and 17(1,M); 17(2,1), ...; ...; and 17 (P,1), ..., and 17 (P,M), in a second plurality of redundant columns and M redundant rows. The second plurality may be three or four. In the arrays 11 and 15, the memory cells 13 or 17 in each column are alternatively referred to collectively as a word line. Those 13 or 17 in each row ate altogether called a bit line.

Such a semiconductor memory device is manufactured through a diffusion process in an extremely clean atmosphere. Despite the clean atmosphere, dusts of a micron order may unavoidably attach to result in a faulty memory cell, bit line, and/or word line. The redundant array 15 is used as a substitution for a faulty link among the ordinary links in the ordinary array 11.

A faulty address indicating circuit 19 is alternatively called a fuse circuit and is used in indicating an address of each faulty link in the ordinary array 11. A like faulty link may appear also in the redundant array 15 and is indicated additionally in the faulty address indicating circuit 19. This circuit 19 is referred to as the fuse circuit because the faulty address indicating circuit 19 comprises a plurality of fuse elements, each of which breaks when an excessive electric current flows through one of the ordinary and the redundant links. When a corresponding fuse element is broken, this one of the links is referred to also as a faulty link.

On accessing a desired one of the ordinary columns or links, an ordinary link selecting circuit (or decoder) 21 is supplied with an ordinary link address signal ADr which may selectively represent first through M-th link addresses x(1) to X(M) corresponding to the first through the M-th ordinary columns to indicate a selected link, such as an m-th link, at a time, where m is variable between 1 and M, both inclusive. A redundant link selecting circuit 23 includes the faulty address indicating circuit 19 and is supplied with the ordinary link address signal. When the ordinary link address signal indicates the faulty link, the redundant link selecting circuit 23 activates a redundant circuitry activating signal RCA and selects one of the redundant links, as a substitution link, that corresponds to the faulty link among the ordinary links. Redundant circuitry refers primarily to the redundant array 15. The substitution link is used in substitution for the faulty link. When the ordinary link address signal does not indicate the faulty link, the redundant link selecting circuit 23 selects none of the redundant links and deactivates the redundant circuitry activating signal.

In the conventional semiconductor device, the redundant circuitry activating signal is delivered as an ordinary link selecting circuit disabling signal RCA1 through a redundant cell test circuit 25 for use in testing the redundant array 15 or, more specifically, the redundant memory cells 17 and the redundant links. A test mode signal TST is activated on testing the redundant array 15. The redundant cell test circuit 25 comprises a pointer 27 for sequentially selecting the redundant links in response to a clock signal CK supplied through an AND gate 29(1). The redundant circuitry activating signal or the text mode signal is delivered through an OR gate 29(2) to the ordinary link selecting circuit 21 as the ordinary link selecting circuit disabling signal.

The ordinary link selecting circuit 21 is operable in the manner described above only while the ordinary link selecting circuit disabling signal Is deactivated. While this signal Is active, the ordinary link selecting circuit 21 selects none of the ordinary links which may not may not be a faulty link.

During manufacture mentioned before, the ordinary memory cells 13 are tested on a wafer by a probe pin of a memory tester for faulty bits. This test will herein be called a wafer test. The faulty bits may appear In various fault patterns. A single bit may be defective. A fault may occur along a word or a bit line. In consideration of these fault patterns, the memory tester is used to decide a redundant link for use in substitution for the faulty link and to make the faulty address indicating circuit 19 indicate the faulty link as by breaking the fuse element in correspondence to the faulty link if the faulty ! ink is Judged by the memory tester as not recoverable.

After the faulty link is so processed, the chip is useable as a product because the substitution link can be used in situ in place of the faulty link. If the substitution link is a faulty link, the chip can not be placed on the market. In view of the fact that the substitution link is usually faultless, it is possible to raise the yield by the semiconductor memory device illustrated with reference to FIG. 1. That is, it is possible in FIG. 1 to make the faulty address indicating circuit 19 indicate a faulty link which may be in the redundant array 15.

In FIGS. 2 and 3, each of other conventional semiconductor memory devices comprises first and second memory blocks 31 or 31(1) and 31(2). In FIG. 2, each memory block 31 comprises the ordinary and the redundant arrays 11 and 15, the faulty address indicating circuit 19, and the ordinary and the redundant link selecting circuits 21 and 23. In FIG. 3, each memory block 31 comprises the ordinary and the redundant arrays 11 and 15. The faulty address indicating circuit 19 and the ordinary and the redundant link selecting circuits 21 and 23 are used in common to the first and the second memory blocks 31. Instead, an R/W (read/write) control circuit 33 is illustrated in each of the memory blocks 31.

The ordinary and the redundant memory cells 13 and 17 (FIG. 1) will hereafter be not depicted merely for simplicity of illustration. In FIGS. 2 and 3, parts common to and used in the first and the second blocks 31 will be called by using modifiers "first" and "second" and will be designated by adding suffixes (1) and (2) to their reference numerals in the manner used in connection with the R/W control circuits 33(1) and 33(2).

Such a semiconductor memory device is used in a memory device for a large memory capacity as in a DRAM of the memory capacity of four megabits or more and is used in processing input/output data of different bit structures, such as an address or a word structure. When the memory capacity is for 16 Mbit, the structure may be 1×16 Mbit, 4×4 Mbit, and 8×2 Mbit. The semiconductor memory device is moreover used at various refresh cycles, such as 2 and 4 kHz. Costs for development would become enormous if these semiconductor memory devices are manufactured on different chips. It has consequently been the practice to use a single chip and to get, in bonding steps of manufacture, the semiconductor memory device for desired ratings.

In FIG. 2, the semiconductor memory device is operable in first and second bit kinds of ordinary column address signals for X(1) to X(M) bits and for X(1) to X(M+1) bits. In FIG. 3, the semiconductor memory device is operable in first and second bit kinds With first and second word kinds of ordinary and redundant row address signals for Y(1) to Y(N) bits by 2N words and fox Y(1) to Y(N+1) bits by N words.

Referring more particularly to FIG. 2, an address format switching circuit 35 is used in common to the first and the second memory blocks 31 and is supplied with an address format switch signal ASX and an additional link address signal X(M+1). The address format switch signal is supplied through an input pad 0r terminal therefor and is selectively given first and second address format levels. Similarly, the additional link address signal is supplied through another input pad as an additional column address signal and is selectively given first and second address levels. It will be surmised merely for simplicity of the description that both of the first address format and address levels have a low or logic zero level and that both of the second address format and address levels have a high or logic one level.

The address format switching circuit 35 comprises first and second OR gates 37 or 37(1) and 37(2) to activate both of the first and the second memory blocks 31 when the address format signal has the second or high level. In this event, the additional link address signal gives no effect or is rendered invalid in the first and the second memory blocks 31. The additional link signal is delivered to the first OR gate 37(1) directly and to the second OR gate 37(2) through an inverter 39. When the address format switch signal has the first or low level, a selected one alone of the first and the second memory blocks 31, for example, the first memory block 31(1), is activated by the additional link address signal. In this event, the semiconductor memory device is operable with a column address signal of the bit structure of the first through the (M+1)-th bits.

Referring now more particularly to FIG. 3, a word format switching circuit 41 is used in common to the first and the second memory blocks 31 and is supplied with a word format switch signal WSX and an additional row address signal Y(N+1). Like the address format switch signal, the word format switch signal is selectively given first and second word format levels. The additional row address signal is selectively given first and second address levels.

The word format switching circuit 41 delivers first and second control signals to the first and the second R/W control circuits 33, respectively, and may comprise two gates and an inverter like the address format switching circuit 25 described in conjunction with FIG. 2. When the word format switch signal and the additional row address signal have the high level, the first and the second control signals are activated to render the additional row address signal ineffective. When the word format switch and the additional row address signals have the low level, the second control signal alone is activated with the second control signal made to represent the additional row address signal.

The first and the second control signals activate the R/W control circuits 33. In this event, the first and the second memory blocks 31 are concurrently activated to put the semiconductor memory device in operation with N bits by 2N words. Representing the additional row address signal, the second control signal activates a correspondingly numbered one of the R/W control circuits 33 alone to be responsive to the additional row address signal. In this event, the semiconductor memory device is operable substantially for (N+1) bits by N words with the first and the second memory blocks 31 individually activated.

It is now clearly understood that it is impossible to test the ordinary array 11 in the test mode described in connection with FIG. 1 even though the test mode signal may additionally be used. Whereas, data hold test is time consuming and must be carried out separately as regards the ordinary arrays 11.

In a semiconductor memory device, the redundant array 15 is manufactured in general adjacent the ordinary array 11 on a common plane. Whereas, these arrays 11 and 15 have been separately tested. This has rendered It impossible to teat adjacent areas of the arrays 11 and 15 for data hold (a hold test) under severe circumstances.

In order to test the redundant array 15, the redundant links (columns and rows) have been accessed by the redundant cell test circuit 25 in FIG. 1. This has resulted in a reduction in the freedom of test patterns particularly for the hold test.

It may appear that use of the redundant array 15 is disadvantageous due to increases in the yield, in cost for tests, and in chip area and therefore in an increase in a total cost performance. It should, however, be noted in a semiconductor memory device of a large memory capacity, that the redundant array or arrays 15 are manufactured along an end side of the chip, where memory cells 13 and/or 17 are very often faulty or defective. As a consequence, use of the redundant array or arrays 15 does not much increase the total cost performance and is desirable.

Figure 4:
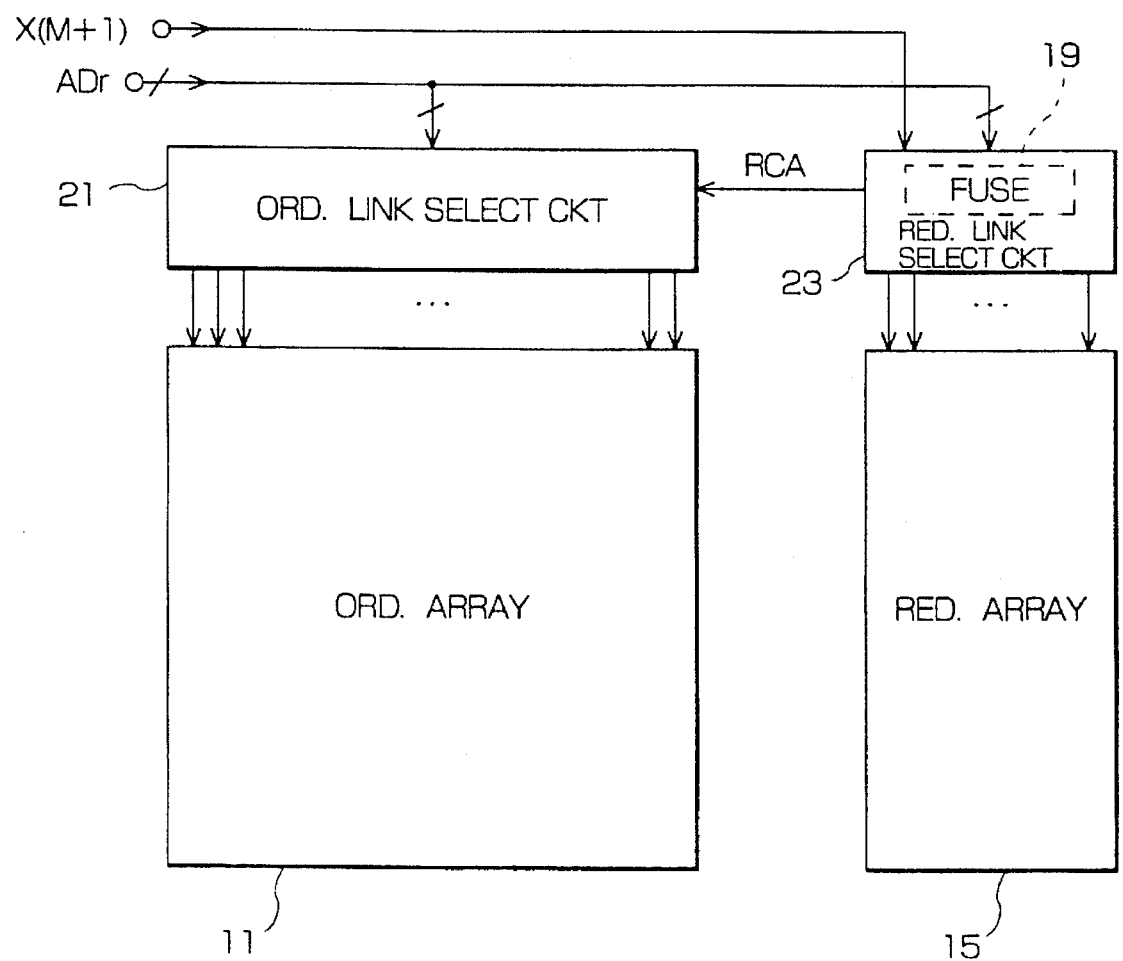
FIG. 4 is a block diagram of a semiconductor memory device according to a first embodiment of the instant invention.

Referring now to FIG. 4, the description will proceed to a semiconductor memory device according to a first embodiment of this invention. This semiconductor memory device is similar to that illustrated with reference to FIG. 1.

Use is not made of the redundant cell test circuit 25 described in conjunction with FIG. 1. The redundant circuitry activating signal RCA is consequently delivered from the redundant link selecting circuit 23 directly to the ordinary link selecting circuit 21. Instead, an additional link address signal X(M+1) is delivered to the redundant link selecting circuit 23 as a "predetermined signal" with its level selectively given first and second levels or low (logic zero) and high (logic one) levels.

In operation, it will first be presumed that the predetermined signal is given the second level. In this event, the faulty address indicating circuit 19 is rendered inoperative. The semiconductor memory device is put in the test mode for the redundant array 15 like in the memory device of FIG. 1.

More specifically, the redundant link selecting circuit 23 activates the redundant circuitry activating signal to suspend operation of the ordinary link selecting circuit 21 when the ordinary link address signal ADr successively indicates the ordinary links and consequently corresponding ones of the redundant links, namely, all the redundant links in a certain order of selection. The redundant link selecting circuit 23 selects in this manner the "substitution link" when the ordinary link address signal indicates the "faulty link" indicated when the faulty address indicating circuit 19 is operative. By read and write circuits and ordinary and redundant row selecting circuits which are known in the art and not depicted, write and read are carried out into and from the redundant memory cells 17 described in connection with FIG. 1. Incidentally, it will now be readily possible to apply the ordinary and the redundant link selecting circuits 21 and 23 to the ordinary and the redundant row selecting circuits.

It will next he presumed that the predetermined signal is given the first level. In this event, the faulty address indicating circuit 19 is operable in the manner described in the foregoing. The semiconductor memory device is operable in a normal or usual manner of operation as well as in the test mode for the ordinary array More in detail, the redundant link selecting circuit 23 activates the redundant circuitry activating signal to suspend operation of the ordinary link selecting circuit 21 only when the ordinary link address signal indicates the faulty address or addresses. Under the circumstances, the redundant link selecting circuit 23 selects in compliance with the ordinary link address signal the substitution link or links which corresponds or correspond in the redundant array 15 to the faulty link or links in the ordinary array 11 and should be substituted in the normal manner of operation for the last-mentioned faulty link or links. The substitution link or links are selected from the redundant links except for that or those indicated, if any, by the faulty link indicating circuit When the ordinary link address signal indicates under the circumstances the ordinary links other than that or those indicated by the faulty address indicating circuit 19, the redundant link selecting circuit deactivates the redundant circuitry indicating signal to make the ordinary link selecting circuit 21 select the last-mentioned ordinary links and to make the redundant link selecting circuit 23 select none of the redundant links. The redundant link selecting circuit 23 is operable in this manner to activate the redundant circuitry activating signal for selection of the substitution link or links when both of the faulty address indicating circuit 19 and the ordinary link address signal indicate in common the faulty link links in the ordinary array 11. The redundant link selecting circuit 23 is moreover operable to deactivate the redundant circuitry activating signal for selection of none of such redundant links but for the normal manner of operation of the ordinary link selecting Circuit 21 when neither the faulty address indicating circuit 19 nor the ordinary link address signal indicates the faulty links.

From the foregoing, it is appreciated that the semiconductor memory device is testable as regards the ordinary and the redundant arrays 11 and 15 end also for the hold test before no faulty link of the ordinary links or of the ordinary and the redundant links is set in the faulty address indicating circuit 19. In order to proceed with such a test, it is only necessary to first give the first or low level to the predetermined signal for test of the ordinary array 11 and subsequently give the second or high level to the predetermined signal for test of the redundant array 15. It is therefore possible to much decrease the test time. In addition, it is possible to hold test the adjacent area. It is furthermore possible to optimally select the test patterns in consideration of the ordinary and the additional link address signals to give a wider freedom to the test pattern.

Figure 5:
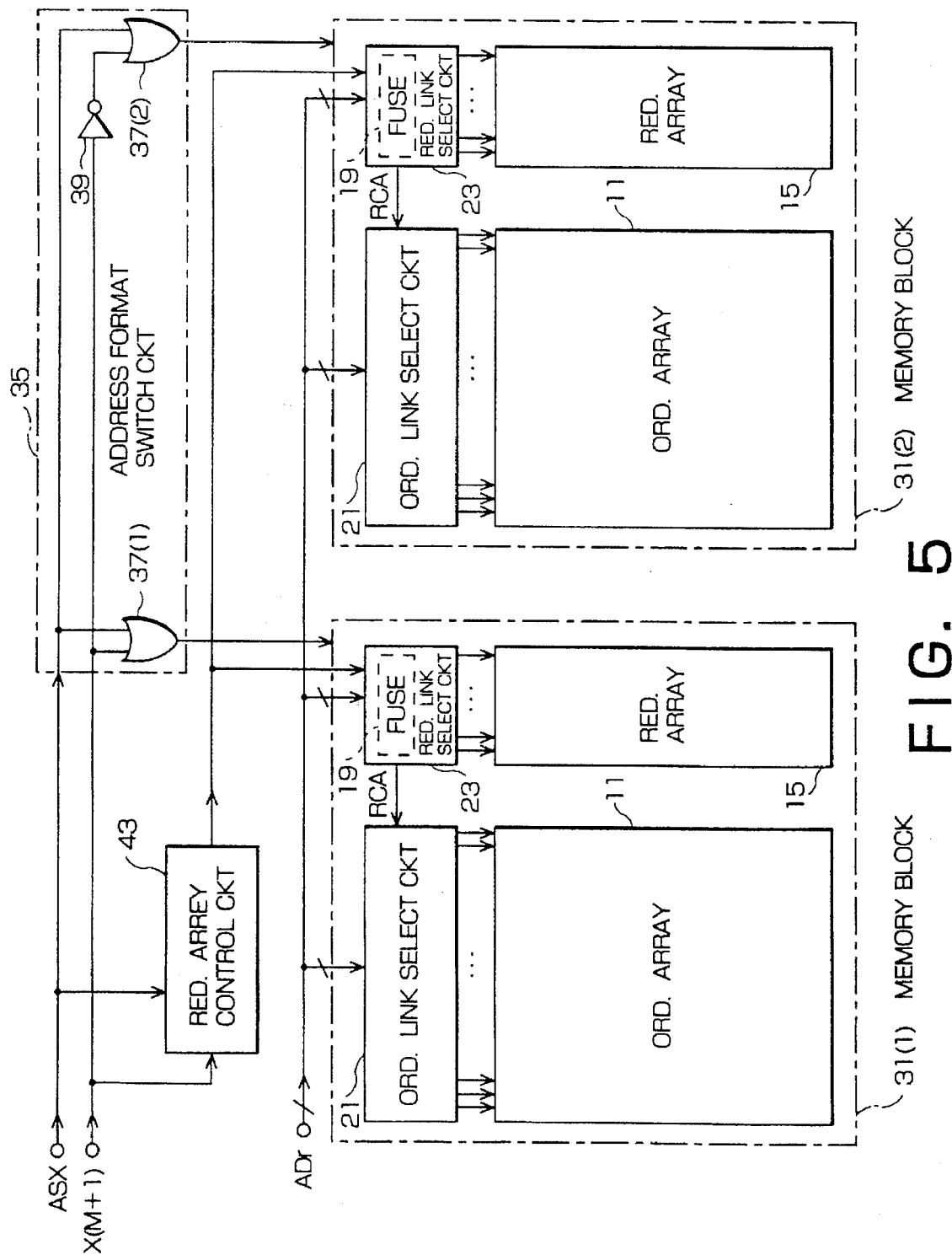
FIG. 5 is a block diagram of a semiconductor memory device according to a second embodiment of this invention.

Turning to FIG. 5, attention will be directed to a semiconductor memory device according to a second embodiment of this invention. This semiconductor memory device is similar to that illustrated with reference to FIG. 2.

In common to the first and the second memory blocks 31, a redundant array control circuit 43 is used to keep the additional link address signal X(M+1) of the first or low level only when the address format switch signal ASX is given the second or high address format level. Kept in the redundant array control circuit 43, the additional link address signal of the second or high level is delivered in the example being illustrated to the redundant link selecting circuit 23 of each memory block 31 despite the fact that the high level of the additional link address signal has not been used in effect in FIG. 2. When the address format switch signal is given the first or the low address format level, the redundant array control circuit 43 keeps the additional link address signal of the first or low level to the redundant link selecting circuit 23 of the first memory block 31(1).

In operation, it will first be presumed that the address format switch signal has the low level. The redundant link selecting circuits 23 are put in the first and the second memory blocks 31 in exactly identical with those in FIG. 2.

It will next be presumed that the address format switch signal has the high level. The first and the second memory blocks 31 are both activated. If no faulty link is set in the faulty address indicating circuits 19, the ordinary link selecting circuits 21 select the ordinary memory cells 13 in the first and the second memory blocks 31 when the additional link address signal has the low level. The redundant link selecting circuits 23 select the redundant memory cells 17 in the first and the second memory blocks 31 when the additional link address signal has the high level. That is, each memory block 31 is operable in exact identical with the semiconductor memory device illustrated with reference to FIG. 4.

In this manner, it is possible for the semiconductor memory device being illustrated to achieve advantages described in connection with FIG. 4. Moreover, it is possible to use a narrower chip area than the conventional one because of a very simple structure (for example, only one logic gate) of the redundant array control circuit 43 and of unnecessity of those redundant cell test circuit 25 and input pads for the test mode signal and the clock signal which are described in conjunction with FIG. 1.

Figure 6:
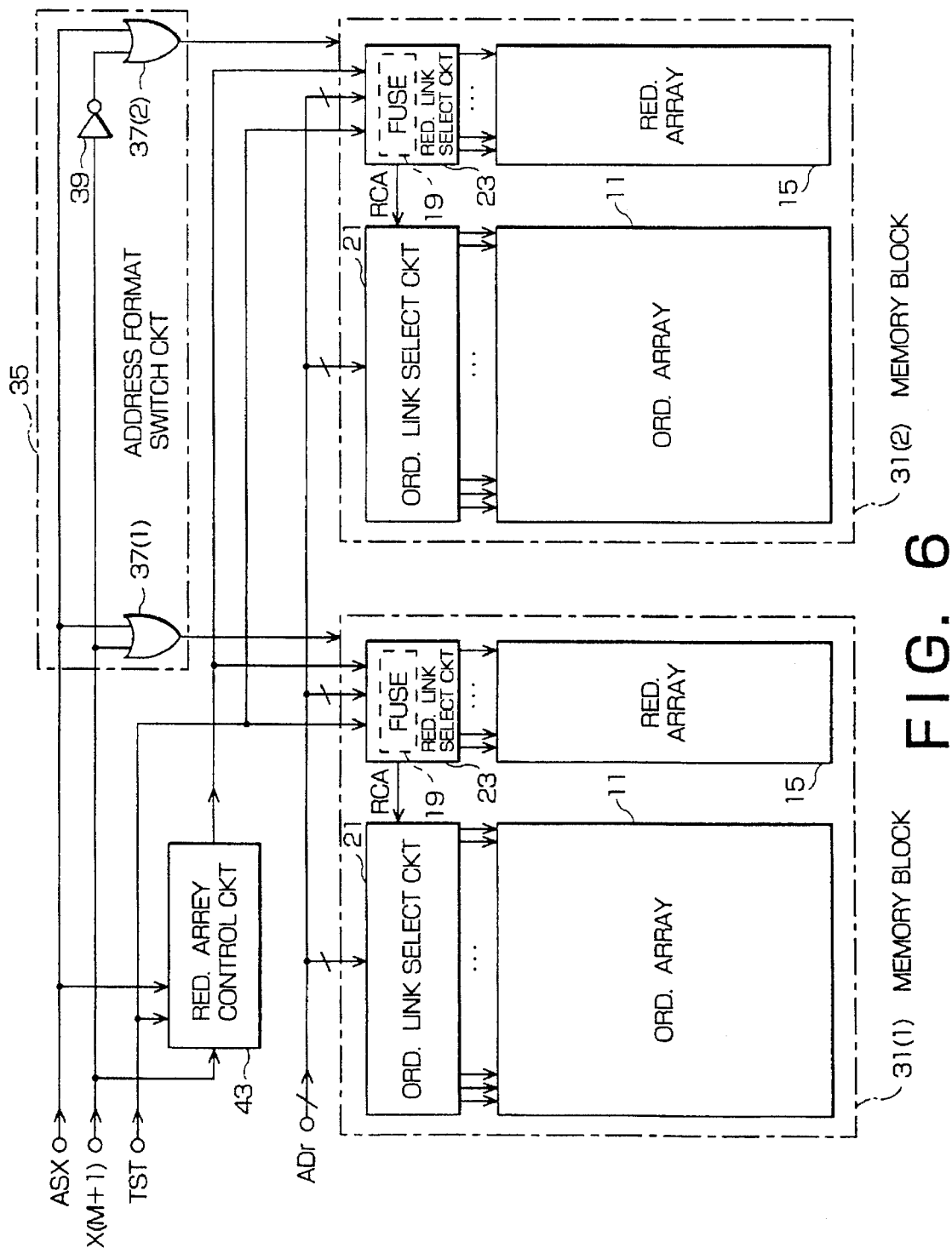
FIG. 6 is a block diagram of a semiconductor memory device according to a third embodiment of this inventions.

Further turning to FIG. 6, attention will be directed to a semiconductor memory device according to a third embodiment of this invention. This semiconductor memory device is similar to that illustrated with reference to FIG. 5, in which it is impossible to test the ordinary array 11 after the faulty link or links are set in the faulty address indicating circuit 19.

In FIG. 6, the redundant array control circuit 43 is supplied with a test mode signal TST which is now selectively given first or low and second or high test mode levels. Furthermore, the test mode signal is delivered to the redundant link selecting circuits 23 in the first and the second memory blocks 31. This is in order to make it possible to test the ordinary arrays 11 even when the faulty link or links are set in the faulty address indicating circuit 19.

It will first be presumed that the test mode signal has the first or low level. The semiconductor memory device is operable in the normal mode of operation, wherein the redundant array control circuit 43 is operable identically with that described in conjunction with FIG. 5. In this event, the redundant link selecting circuit 23 is operable in each memory block 31 as that described in conjunction with FIG. 4. The redundant link selecting circuits 23 are operable in the first and the second memory blocks 31 as those described in connection with FIG. 5.

It will next be presumed that the teat mode signal hag the second or high level. The semiconductor memory device is operable in the test mode.

When the additional link address signal has the first or low level, the redundant link selecting circuits 23 make in the first and the second memory blocks 31 the faulty address indicating circuits 19 inoperative, even when the faulty link or links are set, to deactivate the redundant circuitry activating signals. Under the circumstances, the ordinary link selecting circuits 21 select the ordinary links in compliance with the ordinary link address signal. The redundant link selecting circuits 23 select none of the redundant links. When the additional link address signal has the second or high level, the redundant link selecting circuits 23 activate in the memory blocks 31 the redundant circuitry indicating signals. Under the circumstances, the ordinary link selecting circuits 21 select none of the ordinary links. Instead, the redundant link selecting circuits 23 select the redundant links in correspondence to the ordinary link address signal. In this manner, it is possible to test either of the ordinary and the redundant arrays 11 and 15 in the first and the second memory blocks 31, even after the faulty links are set in the faulty address indicating circuits 19, and 1s possible to put the semiconductor memory device in operation in other respects in the manner described in conjunction with FIG. 5.

Figure 7:
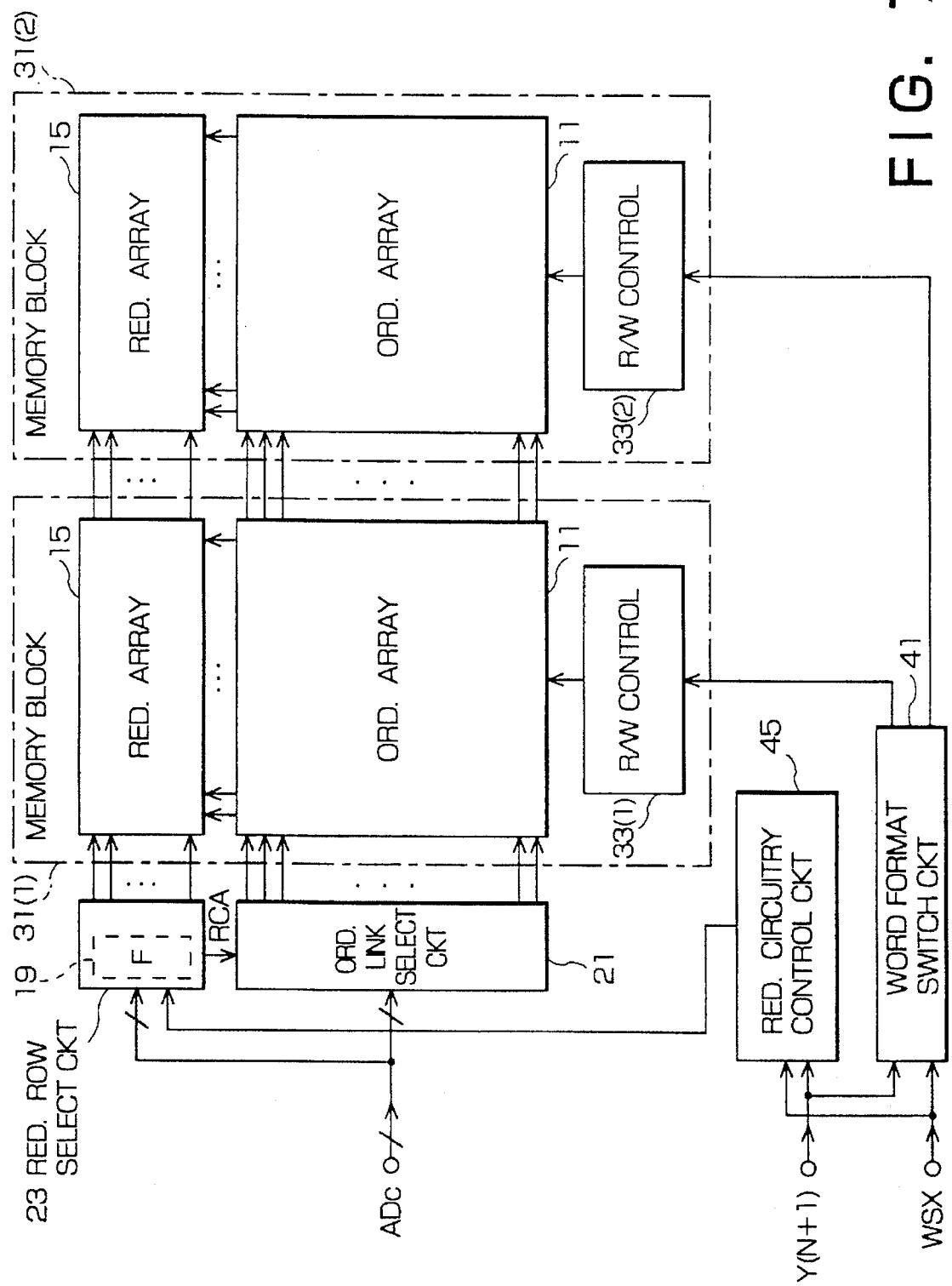
FIG. 7 is block diagram of a semiconductor memory device according to a fourth embodiment of this invention.

Referring afresh to FIG. 7, the description will proceed to a semiconductor memoir/device according to a fourth embodiment of this invention. This semiconductor memory device is similar to that described in conjunction with FIG. 3, wherein the redundant links are selected in the first and the second memory blocks 31 row by row in substitution for the faulty links or faulty rows in the ordinary arrays 11. The redundant link selecting circuit 23 consequently serves as the redundant row selecting circuit.

In common to the first and the second memory blocks 31, the word format switching circuit 41 is used to control the redundant link selecting circuit 23 in response to the word format switch signal WSX of the first Or low and the second or high word format levels and to the additional row address signal Y(N+1) which now selectively has the first or low and the second or high address levels. Furthermore, a redundant circuitry control circuit 45 is supplied with the word format switch signal and the additional row address signal to deliver the additional row address signal to the redundant row selecting circuit 23 with the first and the second address levels when the word format switch signal has the first and the second word format levels, respectively.

In operation, it will first be presumed that the faulty address indicating circuit 19 indicates at least one faulty link or row. In this event, the redundant row selecting circuit 23 activates the redundant circuitry activating signal to select the substitution row or rows in correspondence to the ordinary link or row address signal irrespective of the first and the second address levels given to the additional row address signal. In other events, the redundant row selecting circuit 23 deactivates the redundant circuitry activating signal to put the ordinary link or row selecting circuit 21 in its operation of selecting the ordinary links or rows in the first and the second ordinary arrays 11(1) and 11(2) in compliance with the ordinary row address signal.

It is now understood in FIG. 7 that the semiconductor memory device is put in the test mode for the ordinary and the redundant arrays 11 and 15 of the first and the second memory blocks 31 provided that no faulty row is set in the faulty address indicating circuit 19. This operation is equivalent to similar operations described in conjunction with FIGS. 4 and 5.

In order to put the semiconductor memory device in the test mode even after the faulty row or rows are set in the faulty address indicating circuit 19, it is only necessary in the manner described with reference to FIG. 6 to connect the redundant array control circuit 43 to the redundant row selecting circuit 23 and to supply this redundant array control circuit 43 additionally with the test mode signal selectively given the first or low and the second or high level. In this case, the faulty address indicating circuit 19 is rendered inoperative. Under the circumstances, the redundant row selecting circuit 23 activates the redundant circuitry activating signal to select the redundant rows in the redundant arrays 15 in correspondence to the ordinary row address signal when the additional row address signal has the high level. When the additional row address signal has the low level, the redundant row selecting circuit 23 deactivates the redundant circuitry activating signal to make the ordinary row selecting circuit 21 select the ordinary rows in the ordinary arrays 11 in compliance with the ordinary row address signal.

In the manner described in the foregoing, it is possible in the semiconductor memory devices of this invention to test the ordinary array or arrays 11 and the redundant array or arrays 15 in a common test mode. This enables to shorten the test time, to decrease the ship area, to test the adjacent area of the ordinary array 11 and the redundant array 15, and to raise the freedom of the test patterns.

While this invention has thus far been described in specific conjunction with only a few preferred embodiments thereof, wherein the faulty links in the ordinary array or arrays 11 are substituted for by the substitution links which are selected either column by column or row by row in associated at least one of the redundant arrays 15, it will readily be possible for one skilled in the art to carry this invention into effect in various other manners. Above all, it is possible to use in FIG. 4 an ordinary row selecting circuit either in place of or in addition to the ordinary link or column selecting circuit 21. It is similarly possible to combine the semiconductor memory device of FIG. 6 with that described in conjunction with FIG. 7.

What is claimed is:

1. A semiconductor memory device comprising an ordinary array comprising ordinary memory cells in a first plurality of ordinary links, a redundant array comprising redundant memory cells in redundant links for use as ones, a second plurality in number, of said ordinary links, a faulty address indicating circuit indicative of a faulty link, a redundant link selecting circuit including said faulty address indicating circuit to selectively activate a redundant circuitry activating signal and supplied with an ordinary link address signal indicative of a selected link among said ordinary links at a time to selectively select a substitution link among said redundant links for use in substitution for one of said ordinary links that is indicated as said faulty link, and an ordinary link selecting circuit responsive to said ordinary link address signal and to said redundant circuitry activating signal for selecting said selected link and none of said ordinary links when said redundant circuitry activating signal is not and is activated, respectively, wherein said redundant link selecting circuit is supplied with a predetermined signal selectively given first and second levels so as, when said predetermined signal is given said second level, to render said faulty address indicating circuit inoperative and to select said substitution link when said ordinary link address signal indicates said faulty link and so as, when said predetermined signal is given said first level, to activate said redundant circuitry activating signal for selection of said substitution link and to deactivate said redundant circuitry activating signal for selection of none of said redundant links when both of said faulty address indicating circuit and said ordinary link address signal indicate said faulty link and when neither said faulty address indicating circuit nor said ordinary link address signal indicates said faulty link, respectively.

2. A semiconductor memory device as claimed in claim 1, said ordinary array comprising said ordinary memory cells in ordinary columns, said first plurality in number, and in ordinary rows, said redundant array comprising said redundant memory cells in redundant columns, said second plurality in number, and in redundant rows, wherein said ordinary links are said ordinary columns, said redundant links being said redundant columns.

3. A semiconductor memory device as claimed in claim 1, said ordinary array comprising said ordinary memory cells in ordinary columns and ordinary rows, said first plurality in number, said redundant array comprising said redundant memory cells in redundant columns and redundant rows, said second plurality in number, wherein said ordinary links are said ordinary rows, said redundant links being said redundant rows.

4. A semiconductor memory device as claimed in claim 1, wherein said redundant link selecting circuit selects, when said predetermined signal is given said second level before setting of said faulty link in said faulty address indicating circuit, said redundant links in correspondence to ones of said ordinary links that are indicated by said ordinary link address signal.

5. A semiconductor memory device as claimed in claim 4, wherein said ordinary link selecting circuit selects, when said predetermined signal is given said first level before setting of said faulty link in said faulty address indicating circuit, said ordinary links in compliance with said ordinary link address signal.

6. A semiconductor memory device comprising first and second memory blocks, each comprising an ordinary array comprising ordinary memory cells in a first plurality of ordinary links, a redundant array comprising redundant memory cells in redundant links for use as ones, a second plurality in number, of said ordinary links, a faulty address indicating circuit indicative of a faulty link, a redundant link selecting circuit including said faulty address indicating circuit to selectively activate a redundant circuitry activating signal and supplied with an ordinary link address signal indicative of a selected link among said ordinary links at a time to selectively select a substitution link among said redundant links for use in substitution for one of said ordinary links that is indicates as said faulty link, an ordinary link selecting circuit responsive to said ordinary link address signal for selecting said selected link and none of said ordinary links when said redundant circuitry activating signal is not and is activated, respectively, and an address format selecting circuit responsive to an address format switch signal selectively given first and second address format levels and to an additional link address signal selectively given first and second address levels for activating both of and a selected block of said first and said second memory blocks when said address format switch signal is given said first address format level irrespective of said first and said second address levels of said additional link address signal and when said address format switch signal and said additional link address signal are given said second address format and address levels, respectively, wherein:

said semiconductor memory device further comprises a redundant array control circuit for keeping said additional link address signal of said first and said second address levels as a predetermined signal given first and second levels, respectively, when said address format switch signal is given said second address format level;

said redundant link selecting circuit being supplied, in at least one of said first and said second memory blocks that is activated, with said predetermined signal so as, when said predetermined signal is given said second level, to render said faulty address indicating circuit inoperative and to select said substitution link when said ordinary link address signal indicates said faulty link and so as, when said predetermined signal is given said first level, to activate said redundant circuitry activating signal for selection of said substitution link and to deactivate said redundant circuitry activating signal for selection of none of said redundant links when both of said faulty address indicating circuit and said ordinary link address signal indicate said faulty link and when neither said faulty address indicating circuit nor said ordinary link address signal indicates said faulty link, respectively.

7. A semiconductor memory device as claimed in claim 6, said ordinary array comprising said ordinary memory cells in ordinary columns, said first plurality in number, and in ordinary rows, said redundant array comprising said redundant memory cells in redundant columns, said second plurality in number, and in redundant rows, wherein said ordinary links are said ordinary columns, said redundant links being said redundant columns.

8. A semiconductor memory device as claimed in claim 6, said ordinary array comprising said ordinary memory cells in ordinary columns and ordinary rows, said first plurality in number, said redundant array comprising said redundant memory cells in redundant columns and redundant rows, said second plurality in number, wherein said ordinary links are said ordinary rows, said redundant links being said redundant rows.

9. A semiconductor memory device as claimed in claim 6, further responsive to a test mode signal to be operable in a test mode in response to said ordinary link address signal, said additional link address signal of said first and said second address levels, and said address format signal of said first and said second address format levels with said redundant link selecting circuit and said redundant array control circuit rendered inoperative irrespective of the faulty link indicated by said faulty address indicating circuit, said ordinary link address signal indicating each of said ordinary links at a time as said selected link, wherein said ordinary link selecting circuit is put in operation, when said additional link address signal is given said second address level, of deactivating said redundant circuitry activating signal to select said ordinary links in response to said ordinary link address signal and, when said additional link address signal is given said first address level, of activating said redundant circuitry activating signal to select said redundant links in correspondence to said ordinary link address signal.

10. A semiconductor memory device comprising first and second memory blocks, each comprising an ordinary array comprising ordinary memory cells in ordinary columns, a predetermined integer N in number, and in a first plurality of ordinary rows, a redundant array comprising redundant memory cells In redundant columns, said predetermined integer in number, and in redundant rows for use as ones, a second plurality in number, of said ordinary rows, and a read/write control circuit responsive to a control signal for read/write accessing said ordinary and said redundant arrays, said semiconductor memory device further comprising in common to said first and said second memory blocks a faulty address indicating circuit indicative of a faulty row, a redundant row selecting circuit including said faulty address indicating circuit to selectively activate a redundant circuitry activating signal and supplied with an ordinary row address signal indicative of a selected row among said ordinary rows at a time to selectively select a substitution row among said redundant rows for use in substitution for one of said ordinary rows that is indicated as said faulty row, an ordinary row selecting circuit responsive to said ordinary row address signal for selecting said selected row and none of said ordinary rows when said redundant circuitry activating signal is not and is activated, respectively, and a word format switching circuit responsive to a word format switch signal selectively given first and second word format levels and to an additional row address signal selectively given first and second address levels for producing said control signal without and together with said additional row address signal as first and second control signals when said word format switch signal is given said first and said second word format levels, respectively, said ordinary array being a first and a second array In said first and said second memory blocks, respectively, said read/write control circuit being a first and a second control circuit in said first and said second memory blocks, respectively, said first and said second control circuits being responsive to said first and said second control signals to access said first and said second arrays collectively and individually as an N-bit by 2N-word structure and substantially as an (N+1)-bit by N-word structure with said additional row address signal of said first address level used, respectively, wherein:

said semiconductor memory device still further comprises in common to said first and said second memory blocks a redundant circuitry control circuit responsive to said word format switch signal of said first and said second word format levels for supplying said redundant row selecting circuit with said additional row address signal of said first and said second address levels, respectively;

said redundant row selecting circuit selecting said redundant rows in each of said first and said second memory blocks in correspondence to said ordinary row address signal regardless of said first and said second address levels of said additional row address signal when said ordinary row address signal indicates said faulty row.

\* \* \* \* \*